(12) United States Patent
Irie (10) Patent No.: US 11,589,490 B2
(45) Date of Patent: Feb. 21, 2023

(54) AIR CONTROL DEVICE FOR MOUNTER

(71) Applicant: SINFONIA TECHNOLOGY CO., LTD., Tokyo (JP)

(72) Inventor: Susumu Irie, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 366 days.

(21) Appl. No.: 16/759,190

(22) PCT Filed: Jan. 10, 2018

(86) PCT No.: PCT/JP2018/000310
§ 371 (c)(1),
(2) Date: Apr. 24, 2020

(87) PCT Pub. No.: WO2019/082404
PCT Pub. Date: May 2, 2019

(65) Prior Publication Data
US 2021/0185867 A1    Jun. 17, 2021

(30) Foreign Application Priority Data

Oct. 26, 2017   (JP) .............................. JP2017-206747

(51) Int. Cl.
*B25B 11/00*    (2006.01)
*B65G 47/84*    (2006.01)
(Continued)

(52) U.S. Cl.
CPC ........ *H05K 13/0409* (2018.08); *B25B 11/005* (2013.01); *B65G 47/848* (2013.01);
(Continued)

(58) Field of Classification Search
CPC ..... H05K 13/0409; B65G 47/917; F04F 5/52; F04F 5/22; F04F 5/467; F04F 5/466; F04F 5/48; F04F 5/16; F04F 5/54; F04F 1/06
(Continued)

(56) References Cited

U.S. PATENT DOCUMENTS 3,854,884 A * 12/1974 Robison .............. C01B 17/0452
                                                      204/405
3,881,480 A *  5/1975 Lafourcade ....... A61M 16/0012
                                                      128/205.24
(Continued)

FOREIGN PATENT DOCUMENTS

JP        1-246899 A    10/1989
JP        2003-23294 A   1/2003
(Continued)

OTHER PUBLICATIONS

International Search Report dated Mar. 6, 2018, issued in counterpart International Application No. PCT/JP2018/000310, with English Translation. (4 pages).
(Continued)

*Primary Examiner* — Kenneth J Hansen
*Assistant Examiner* — Benjamin Doyle
(74) *Attorney, Agent, or Firm* — WHDA, LLP (57) ABSTRACT

This air control device for mounter is to solve a problem of realizing an air control device for a mounter capable of providing a secured holding state by a nozzle without damaging a part by adjusting, during vacuum suction, an amount of air to be drawn suitably for the part and the nozzle.

This air control device for mounter is configured such that a nozzle n detachably attached to a head module HM of a mounter is connected to a negative pressure region, and a
(Continued)

part is suctioned at a distal end of the nozzle n. The head module HM is mounted with a variable throttle mechanism 4, and by using the variable throttle mechanism 4, an amount of air to be drawn into the negative pressure region from the nozzle is adjustable.

5 Claims, 11 Drawing Sheets

(51) Int. Cl.
    *F04B 49/22* (2006.01)
    *H05K 13/04* (2006.01)
    *B65G 47/91* (2006.01)
    *F04F 5/52* (2006.01)

(52) U.S. Cl.
    CPC .......... *B65G 47/917* (2013.01); *F04B 49/225* (2013.01); *F04F 5/52* (2013.01)

(58) Field of Classification Search
    USPC .................................. 417/163, 170, 174, 184
    See application file for complete search history.

(56) References Cited

U.S. PATENT DOCUMENTS

| | | | |
|---|---|---|---|
| 2012/0016563 A1* | 1/2012 | Ohsaki | ................ F02D 41/2403 |
| | | | 701/102 |
| 2014/0227734 A1* | 8/2014 | Hariyama | ............... H01J 37/20 |
| | | | 435/29 |

FOREIGN PATENT DOCUMENTS

| | | |
|---|---|---|
| JP | 2003-273588 A | 9/2003 |
| JP | 2008-004793 A | 1/2008 |
| JP | 2010-287650 A | 12/2010 |
| JP | 2014-123612 A | 7/2014 |
| JP | 2014123612 A * | 7/2014 |
| JP | 2017-98308 A | 6/2017 |
| WO | 2015/011751 A1 | 1/2015 |

OTHER PUBLICATIONS

Extended (Supplementary) European Search Report dated Jul. 5, 2021, issued in counterpart EP Application No. 18871677.3. (8 pages).

* cited by examiner

AIR CONTROL DEVICE FOR MOUNTER

TECHNICAL FIELD

The present invention relates to an air control device for a mounter configured to appropriately suction a part by vacuum using a nozzle through a head module of a mounter.

BACKGROUND ART

Conventionally, a mounter is known as a device for mounting a part on a printed circuit board (for example, Patent Document 1).

This type of mounter includes a head module movable in XY-axis directions, and a nozzle is attached to the head module. The mounter is configured so that a component to be mounted (hereinafter, referred to as "part") is suctioned to a distal end of the nozzle and then released therefrom, and is mounted on a printed circuit board. The head module includes an air cylinder or a servo motor for moving the nozzle vertically in a Z-axis direction.

An operation of the head module will be described with reference to FIG. 2 of Patent Document 1. After a part P is suctioned by a vacuum pump 66, the part P is mounted on the printed circuit board if the part P is released by an air pipe 68, that is, by vacuum breakage. A valve 62 is used for switching during the above operation.

PRIOR ART DOCUMENT

Patent Document

Patent Document 1: Japanese Unexamined Patent Application Publication No. 2014-123612

SUMMARY OF THE INVENTION

Technical Problem

Here, one head module includes, for example, 1, 2, 4, 8, 12, and 24 nozzles, and each of the nozzles includes one throttle valve. An upstream side of the throttle valve is connected via a common regulator to the air pipe or the like being a positive pressure region.

Figure 9:
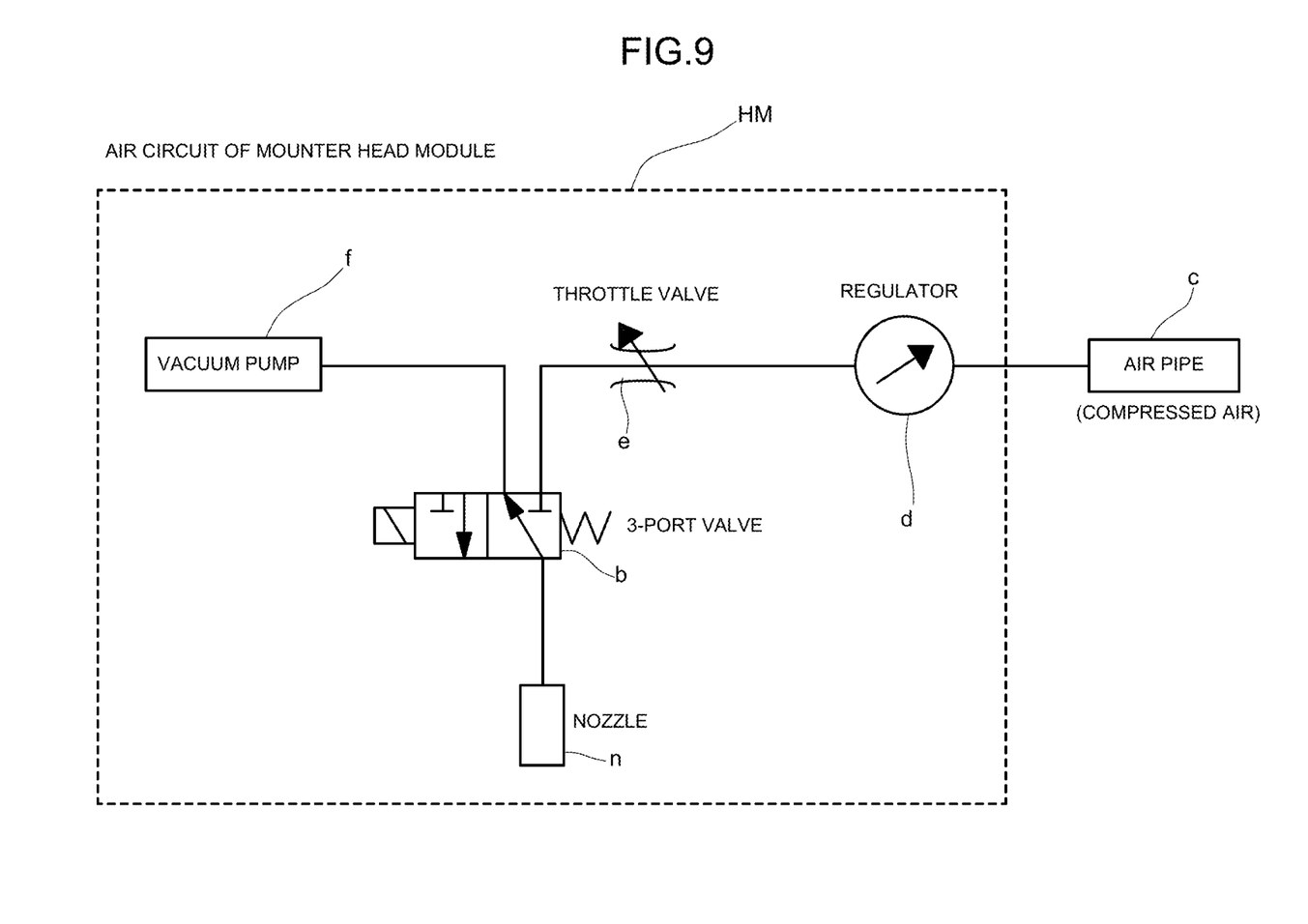
FIG. 9 is a diagram illustrating an example of a conventional air control device.

FIG. 9 illustrates, while focusing only on one nozzle n, a configuration where the nozzle n is reciprocally connected to a positive pressure region and a negative pressure region via a 3-port valve b being a solenoid valve within a head module HM, and at the positive pressure region air is supplied from an air pipe c via a regulator d and a throttle valve e, and the nozzle n is directly connected to a vacuum pump being the negative pressure region while a part is suctioned. As many nozzles n, 3-port valves b, and throttle valves e as the nozzles are provided in parallel between the regulator d and a vacuum pump f.

Figure 10:
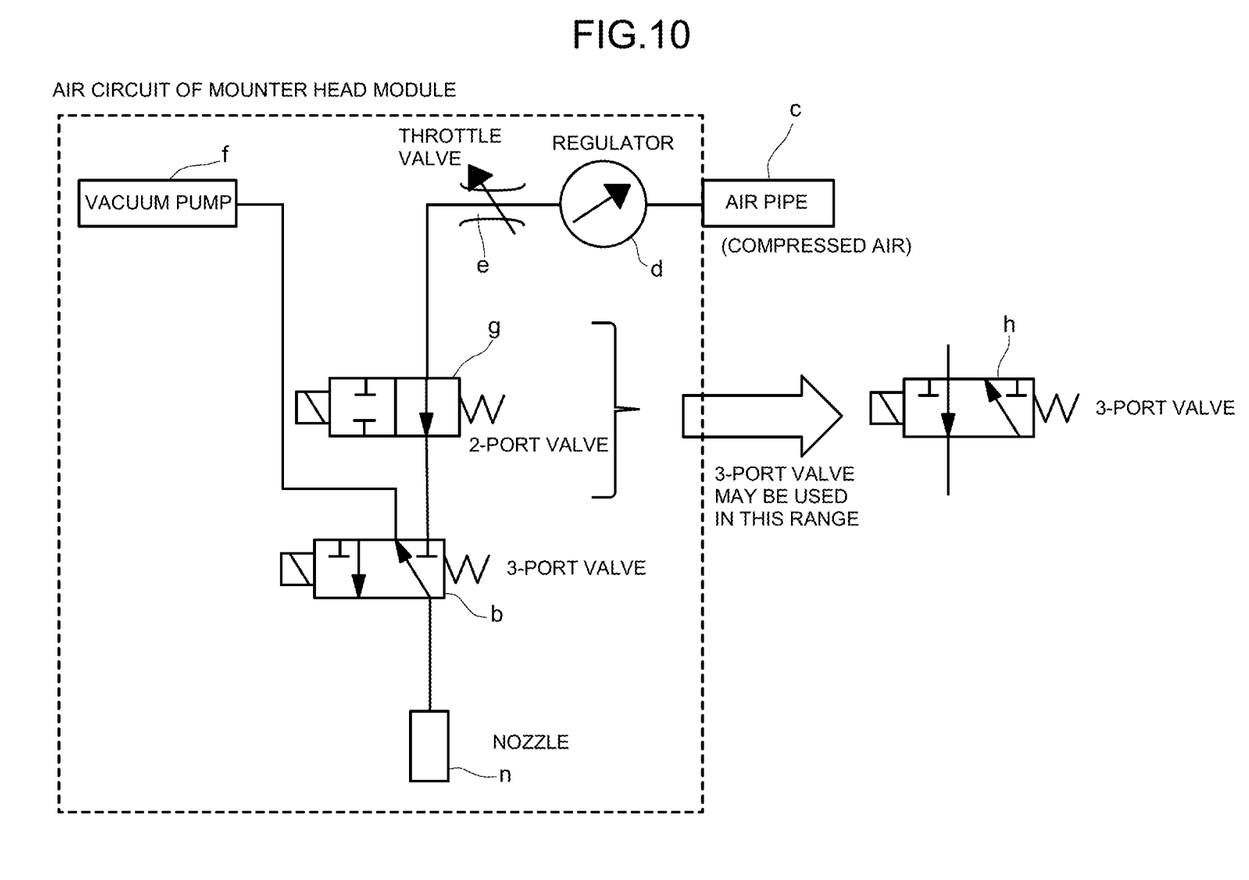
FIG. 10 is a diagram illustrating another example of a conventional air control device.

A configuration in FIG. 10 is in much the same way as the configuration in FIG. 9 where the nozzle n can be selectively switched either to the positive pressure region or to the negative pressure region by the 3-port valve b. The configuration in FIG. 10 and the configuration in FIG. 9 differ in that a supply of air to the 3-port valve b can be turned on or off by a 3-port valve h or a 2-port valve g being a solenoid valve at an upstream of the 3-port valve b, and the nozzle n is directly connected to the vacuum pump f being the negative pressure region while a part is suctioned.

Figure 11:
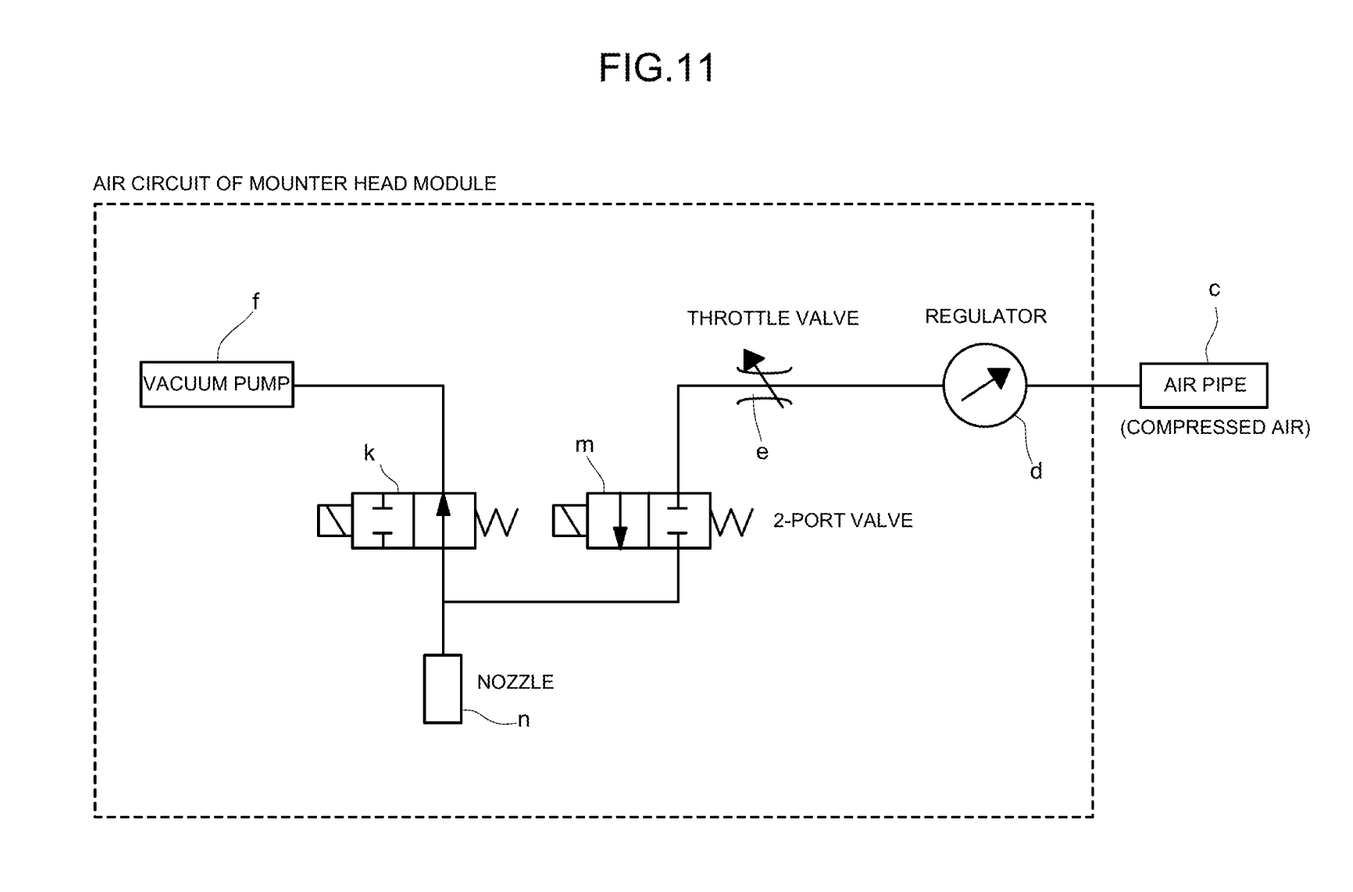
FIG. 11 is a diagram illustrating an example of a conventional air control device, which is different from the previous examples.

Further, a configuration in FIG. 11 is in which a 2-port valve m configured to shut off or connect the nozzle n from or to the positive pressure region and a 2-port valve k configured to shut off or connect the nozzle n from or to the negative pressure region are connected in parallel with respect to the nozzle n, and the nozzle n is directly connected to a vacuum pump f being the negative pressure region while a part is suctioned.

Such a head module HM is roughly classified into a high-speed type and a multi-function type. The high-speed type is configured, for example, for mounting small chip components for a smartphone, has a large number of nozzles n with a small nozzle diameter, and is set to have a small flow rate of air supplied for vacuum breakage after parts are suctioned. On the other hand, the multi-function type is configured, for example, for mounting relatively large deformed parts such as a connector, has a small number of nozzles n with a large nozzle diameter, and is set to have a relatively large flow rate of air supplied for vacuum breakage after parts are suctioned. Therefore, adjustments of the throttle valve e and the regulator d in FIG. 9 to FIG. 10 differ depending on applications of the head module HM, and a plurality of types of head modules HM are prepared for high-speed application and for multi-function application.

However, although an amount of air suctioned for suctioning parts is conventionally considered at initial setting, the amount of air suctioned is not considered for each of types of parts and nozzles.

When parts are suctioned by a nozzle, a time period required to reach a target negative pressure value is determined based on a negative pressure value of the vacuum pump and a flow path resistance, and thus, if an amount of air to be drawn from the nozzle or the parts is small, it takes time to reach the required degree of vacuum, and as a result, there occurs a new problem that efficiency is decreased. Conversely, if the amount of air to be drawn from the nozzles or the parts is too large, a drawing force may be too strong to cause damage to the parts. If the parts are damaged, the yield decreases, and in addition, there arises a problem that a device operation rate decreases due to readjustment.

To cope with such a problem, it is necessary to prepare head modules with different amounts of air to be drawn at least depending on the high-speed application and the multi-function application, and if a nozzle is replaced with another type of nozzle, it is necessary to reset the amount of air to be drawn, and in this case, it is desired that the head modules have a common configuration as much as possible so that the amount of air to be drawn from the negative pressure region can be adjusted.

Further, if it is necessary to replace the nozzle n to change a part when the mounter is operating, the nozzle n is typically replaced without stopping the operation of the device; however, if it is necessary to replace the head module HM, it is necessary to stop the device, which leads to a reduction in facility operation rate.

Therefore, as a countermeasure, one head module HM may possibly be used for both the high-speed application and the multi-function application; however, in this case, when parts being components to be mounted are changed or the nozzle is replaced during operation, it is further desirable that the amount of air to be drawn can be changed in the head module HM without stopping the operation of the device.

The present invention has been made in view of such problems, and an object thereof is to realize an unconventional air control device for a mounter capable of providing a secured holding state by a nozzle without damaging a part by adjusting, during vacuum suction, an amount of air to be drawn suitably for the part and the nozzle, and capable of effectively improving a device operation rate.

Solution to Problem

The present invention adopts the following means to solve the above-described problems.

That is, an air control device according to the present invention is configured such that a nozzle detachably attached to a head module of a mounter is connected to a negative pressure region, and a part is suctioned at a distal end of the nozzle. The head module is mounted with a variable throttle mechanism, and by using the variable throttle mechanism, an amount of air to be drawn into the negative pressure region from the nozzle is adjustable.

Thus, the variable throttle mechanism can adjust the amount of air to be drawn from the nozzle, and therefore, each nozzle can appropriately suction a part by vacuum. Therefore, the number of types of parts and nozzles that can be appropriately handled in one head module increases to improve versatility.

In this case, a desirable configuration is such that the variable throttle mechanism is made electrically controllable, a control unit is connected to the variable throttle mechanism, and the control unit is configured to control a flow rate of the variable throttle mechanism, based on a predetermined applied voltage or applied current.

Thus, it is possible to draw air according to types of parts and nozzles without stopping an operation of the mounter. Therefore, a facility operation rate can be also improved.

Alternatively, it is also desirable that the variable throttle mechanism includes a plurality of the variable throttle mechanisms for different applications, and is set with a flow rate according to the applications.

Thus, it is possible to control the variable throttle mechanism to adjust an amount of air to be drawn suitably for applications such as high-speed or multi-function applications to provide a flow rate control in which the amount of air to be drawn is decreased for a small component and the amount of air to be drawn is increased for a large component. This provides high versatility without replacing the head module, reduces the number of components as a result of sharing the head module, and improves the facility operation rate because a need of replacing the head module can be eliminated.

If a plurality of variable throttle mechanisms are provided for each of a plurality of nozzles so that the flow rate is set according to each in the plurality of nozzles, it is possible to finely control an amount of air to be drawn for each of the nozzles irrespective of whether applications are the same or different from each other.

If the head module of the mounter is further mounted with a flow rate adjustment mechanism interposed between a positive pressure region and the nozzle and configured to change a flow rate of air from the positive pressure region toward the nozzle by electric driving, and the control unit is configured to control a flow rate of the flow rate adjustment mechanism, based on a predetermined applied voltage or applied current, to break a vacuum in the nozzle, the flow rate adjustment mechanism can adjust a flow rate of air to be supplied to the nozzle, and thus, it is possible to adjust a flow rate for the vacuum breakage according to types of parts and nozzles without stopping the operation of the mounter. Therefore, in this respect also, types of parts and nozzles that can be appropriately handled in one head module are increased to improve the facility operation rate.

If the control unit includes: a setting unit configured to previously set an applied voltage value or an applied current value; and an output control unit configured to output, to a control target, the voltage value or the current value set by the setting unit as a result of an ON/OFF command being input to the control unit, it is possible to exactly digitally manage a flow rate and a pressure, and to instantaneously provide an appropriate flow rate control when the voltage is applied or the current is applied by the ON/OFF command once the applied voltage value or the applied current value is set.

Specific embodiments include an embodiment in which a piezoelectric valve is employed for the variable throttle mechanism and an embodiment in which a proportional valve is employed for the variable throttle mechanism.

Advantageous Effect of the Invention

Thus, according to the present invention described above, it is possible to provide a novel and useful air control device for a mounter capable of providing a secured holding state by a nozzle without damaging a part by adjusting, during vacuum suction, an amount of air to be drawn suitably for the part and the nozzle, and capable of effectively improving a device operation rate.

DESCRIPTION OF THE EMBODIMENT

Embodiments of the present invention will be explained below with reference to the drawings.

First Embodiment

Figure 1:
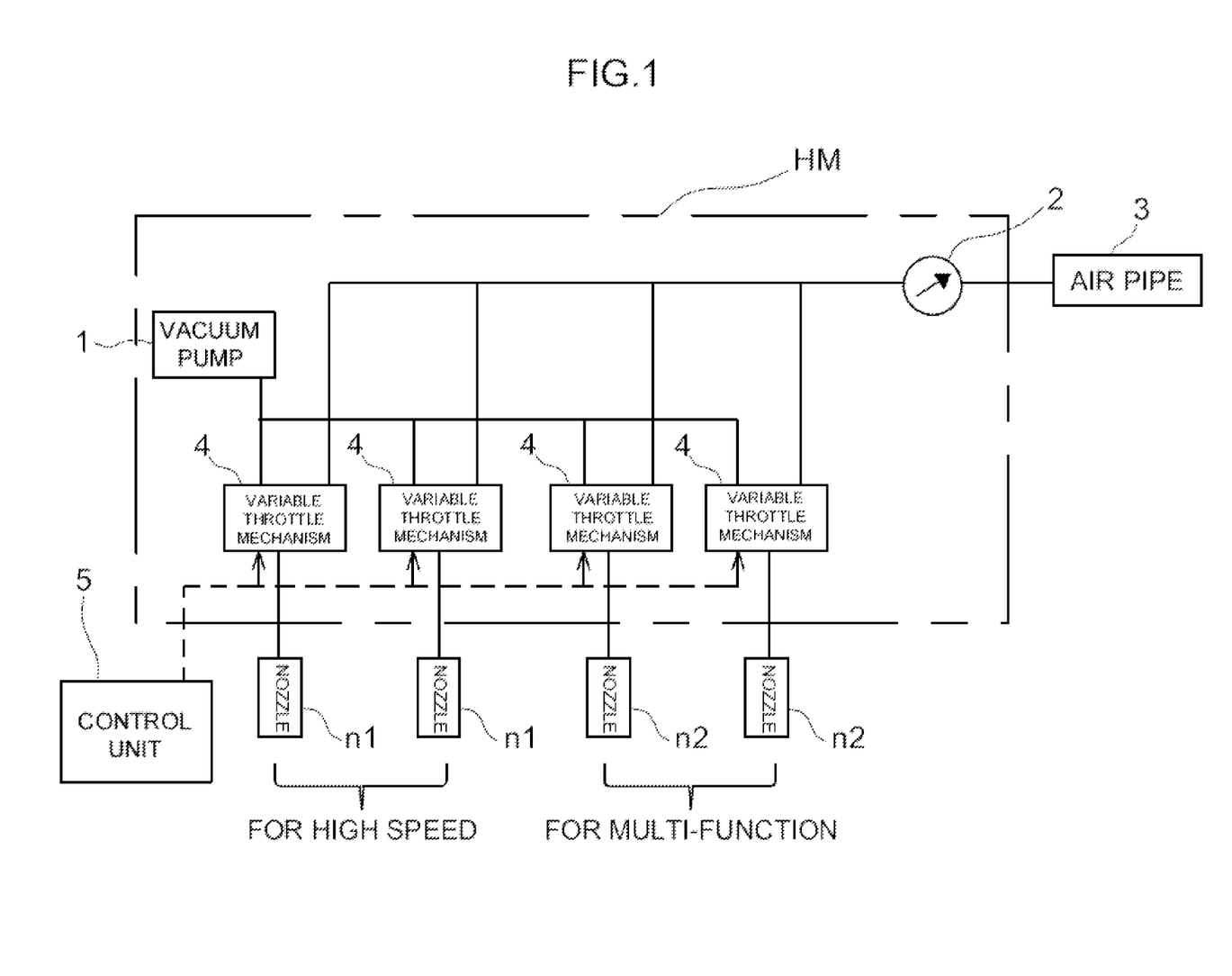
FIG. 1 is a diagram illustrating an air circuit configuration of a head module being a constituent component of a mounter to which the present invention is applied.

As illustrated in FIG. 1, a head module HM of a mounter to which an air control device for a mounter according to the present embodiment is applied includes a vacuum pump 1 configuring a negative pressure region and a regulator 2 arranged in a positive pressure region, where the regulator 2 is connected to an air pipe 3 serving as a compressed air source also in the positive pressure region. The head module HM is configured to be attached with a nozzle n1 suitable for a conventional high-speed application and a nozzle n2 suitable for a multi-function application, where the nozzle n1 for a high-speed application includes a plurality of different types of the nozzles n1 having different diameters, and the nozzle n2 for a multi-function application includes a plurality of different types of the nozzle n2 having different diameters. A variable throttle mechanism 4 is connected to each of the nozzles n1 . . . , n2 . . . , and a circuit on an upstream vacuum breakage side of the variable throttle mechanism 4 is connected in parallel to the common regulator 2, and a circuits on an upstream suction side thereof is connected to the common vacuum pump 1.

The variable throttle mechanism 4 adopts a mechanism capable of continuously changing a flow rate by electric driving, and a control unit 5 for controlling the variable throttle mechanism 4 is provided and configured to control a throttle, based on a required applied voltage or applied current from control unit 5. Further, the control unit 5 is configured to control the variable throttle mechanism 4 to break a vacuum by supplying air toward the nozzle n (n1 or n2) after a part is suctioned.

Figure 2:
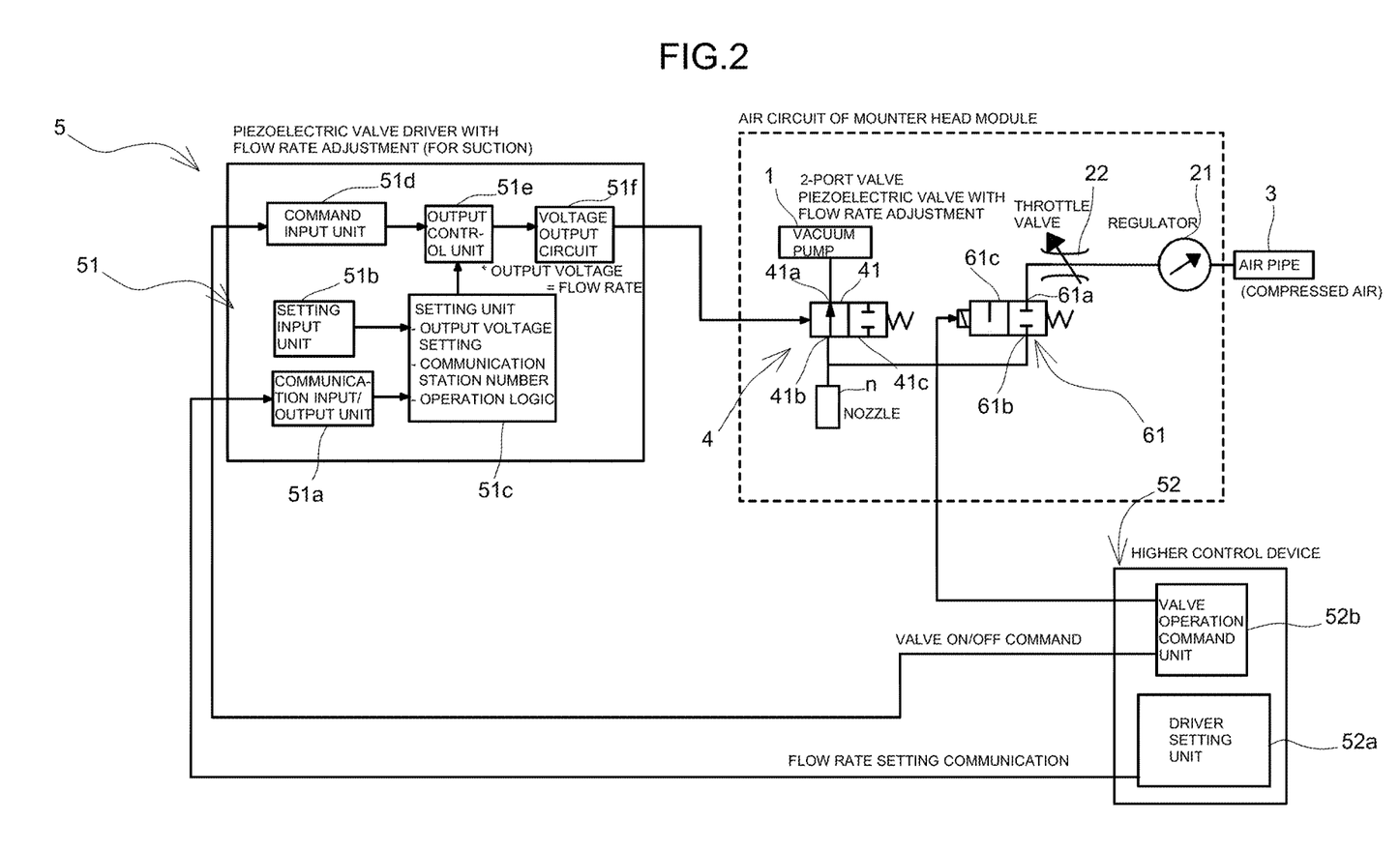
FIG. 2 is a diagram illustrating an air control device according to a first embodiment of the present invention.

FIG. 2 illustrates the variable throttle mechanism 4 included in the air control device for a mounter, for one nozzle n (n1 or n2), and the control unit 5 configured to control the variable throttle mechanism 4, where the variable throttle mechanism 4 includes a throttle valve 41 for vacuum suction by the nozzle n. Additionally, the control unit 5 is configured to also control an air supply switching valve 61. This circuit configuration is improved from that of a conventional example in FIG. 11.

The throttle valve 41 is configured of a 2-port valve having a flow rate adjustment function where an activation unit 41c is interposed between a first port 41a communicating to a suction port of the vacuum pump 1 configuring a negative pressure region and a second port 41b communicating to the nozzle n, and the 2-port valve shuts off the communication between the both ports 41a and 41b at a first activation position and allows the communication between the both ports 41a and 41b at a second activation position. Specifically, the throttle valve 41 is a piezoelectric valve using a piezo element, is configured to be normally closed, and has a function in which a flow rate is variable as a result of the activation unit 41c being continuously deformed or displaced between the first activation position and the second activation position according to a level of voltage applied from outside to thereby change an amount of air to be drawn. Therefore, the 2-port valve 41 enables fine adjustment of the amount of air to be drawn from the nozzle n. The throttle valve 41, which employs a piezoelectric valve, is characterized in that responsiveness after a voltage is applied is quicker than, for example, an electromagnetic valve or a proportional valve.

The switching valve 61 is configured of a 2-port valve where an activation unit 61c is interposed between a third port 61a communicating to a discharge port of the air pipe 3 being the positive pressure region via the regulator 21 and a throttle valve 22, and a fourth port 61b communicating to the nozzle n, and the 2-port valve shuts off the communication between the both ports 61a and 61b at a first switching position and allows the communication between the both ports 61a and 61b at a second switching position. Specifically, the valve 61 is a solenoid valve, is configured to be normally closed, and the activation unit 61c is switched from the first switching position to the second switching position in response to an external voltage command. The throttle valve 22 is a throttle valve to be manually adjusted, and is used with fixedly throttled during operation of the device.

On the other hand, the control unit 5 includes a piezoelectric valve driver 51 connected to a higher control device 52.

The piezoelectric valve driver 51 includes a communication input/output unit 51a, a setting input unit 51b, a setting unit 51c, a command input unit 51d, an output control unit 51e, and a voltage output circuit 51f. The higher control device 52 includes a driver setting unit 52a and a valve operation command unit 52b.

The driver setting unit 52a sets the flow rate to the setting unit 51c of the piezoelectric valve driver 51 through the communication input/output unit 51a. Further, the valve operation command unit 52b inputs a valve on/off command to the piezoelectric valve driver 51 and the solenoid valve 61. The valve operation command unit 52b includes a communication station number indicating which valve is to be driven.

If the communication input/output unit 51a is a communication means using data communication represented by RS485, Ethernet, CAN, or the like, upon flow rate setting data being input into the communication input/output unit 51a, the piezoelectric valve driver 51 writes the input data into the setting unit 51c. As a result, the setting unit 51c holds an output voltage setting, a communication station number, and an operation logic for each nozzle type. The output voltage setting is a setting relating to a flow rate (level of valve opening), the communication station number identifies which piezoelectric valve 41 is to be set, and the operation logic is used to set switching between a synchronous output and a one-shot output with respect to a signal of the command input unit 51d, set a voltage output waveform such as rising and falling, and set a one-shot pulse time, for example.

Next, a case will be described where the communication input/output unit 51a uses a communication means based on switching such as a contact input. The piezoelectric valve driver 51 uses the setting input unit 51b to write into the setting unit 51c an output voltage setting, an operation logic, switching between a synchronous output and a one-shot output, setting of a voltage output waveform such as rising and falling, setting of a one-shot pulse time, and the like. One group includes these setting values, and a plurality of groups are stored. When a switching means such as a contact input is used to switch groups, it is possible to perform a setting switch faster than a data communication means.

In such a configuration, the higher control device 52 first turns on the piezoelectric valve driver 51 while the solenoid valve 61 is off when a mounted component (part) is suctioned. Accordingly, the piezoelectric valve driver 51 applies an output voltage to the piezoelectric valve 41 of the corresponding nozzle n via the output control unit 51e and the voltage output circuit 51f, according to the operation logic set by the setting unit 51c in association with the communication station number. In this way, the applied voltage is determined in advance, and thus, the responsiveness of the nozzle suction is fastened.

In the piezoelectric valve 41, the activation unit 41c is continuously displaced in accordance with the applied voltage, and the piezoelectric valve 41 draws air with a throttle most suitable for the type of nozzle. Thus, the mounted component is suctioned, then the valve operation command unit 52b turns off the piezoelectric valve 41 and turns on the solenoid valve 61 through the piezoelectric valve driver 51. As a result, the air from the air pipe 3 reaches the nozzle n, and the suctioned part is released by vacuum breakage. The released part is mounted on a target printed circuit board.

To increase the efficiency of the mounter, the higher control device 52 outputs a valve operation command in parallel to movement of the nozzle n along XYZ axes before the head module HM reaches a target position, assuming a delay of a valve and a delay of a pressure change until a nozzle distal end reaches a target pressure.

As described above, the air control device for a mounter according to the present embodiment has a configuration in which the nozzle n detachably attached to the head module HM of the mounter is connected to the vacuum pump 1 configuring a negative pressure region and a part can be suctioned to the distal end of the nozzle n, where the variable throttle mechanism 4 is mounted on the head module HM, and the variable throttle mechanism 4 can adjust an amount of air to be drawn into the negative pressure region from the nozzle n.

Thus, the variable throttle mechanism 4 can adjust an amount of air to be drawn from the nozzle n, and therefore, each nozzle n (n1, n2) can appropriately suction a part. Therefore, the number of types of parts and nozzles n that can be appropriately handled in one head module HM increases to improve versatility.

In particular, the variable throttle mechanism 4 is to be electrically controllable, and in addition, the variable throttle mechanism 4 is connected to the control unit 5, and the control unit 5 controls the flow rate of the variable throttle mechanism 4, based on the predetermined applied voltage or applied current, and therefore, it is possible to draw air according to types of parts and nozzles n without stopping an operation of the mounter to improve the facility operation rate.

Further, the variable throttle mechanism 4 includes a plurality of the variable throttle mechanisms 4 provided for different applications, and thus, the plurality of variable throttle mechanisms 4 are set with a flow rate according to the applications, and in addition, it is possible to control an amount of air to be drawn suitably for applications such as a high-speed application and a multi-function application, on the variable throttle mechanism 4. As a result, it is possible to provide a flow rate control where the drawing amount is decreased for a small component and the drawing amount is increased for a large component. This allows for high versatility without replacing the head module HM, and as a result, it is possible to reduce the number of components by sharing the head module HM and improve the facility operation rate because a need of replacing the head module HM can be eliminated.

The plurality of variable throttle mechanisms 4 are provided for each of a plurality of the nozzles n, and a flow rate is set for each of the nozzles n, and thus, it is possible to finely control an amount of air to be drawn for each of the nozzles n irrespective of whether applications are the same or different from each other.

Further, the control unit 5 includes the setting unit 51c configured to previously set an applied voltage value or an applied current value and the output control unit 51e configured to output, to a control target, a voltage value or a current value set by the setting unit 51c as a result of an ON/OFF command being input to the control unit 5, and thus, it is possible to exactly digitally manage a flow rate and a pressure, and to instantaneously provide an appropriate flow rate control when the voltage is applied or the current is applied by the ON/OFF command once the applied voltage value or the applied current value is set.

The variable throttle mechanism 4 is configured by employing the piezoelectric valve 41 with a flow rate adjustment function, and therefore, it is possible to realize a high-speed, long-life air control device.

Second Embodiment

Figure 3:
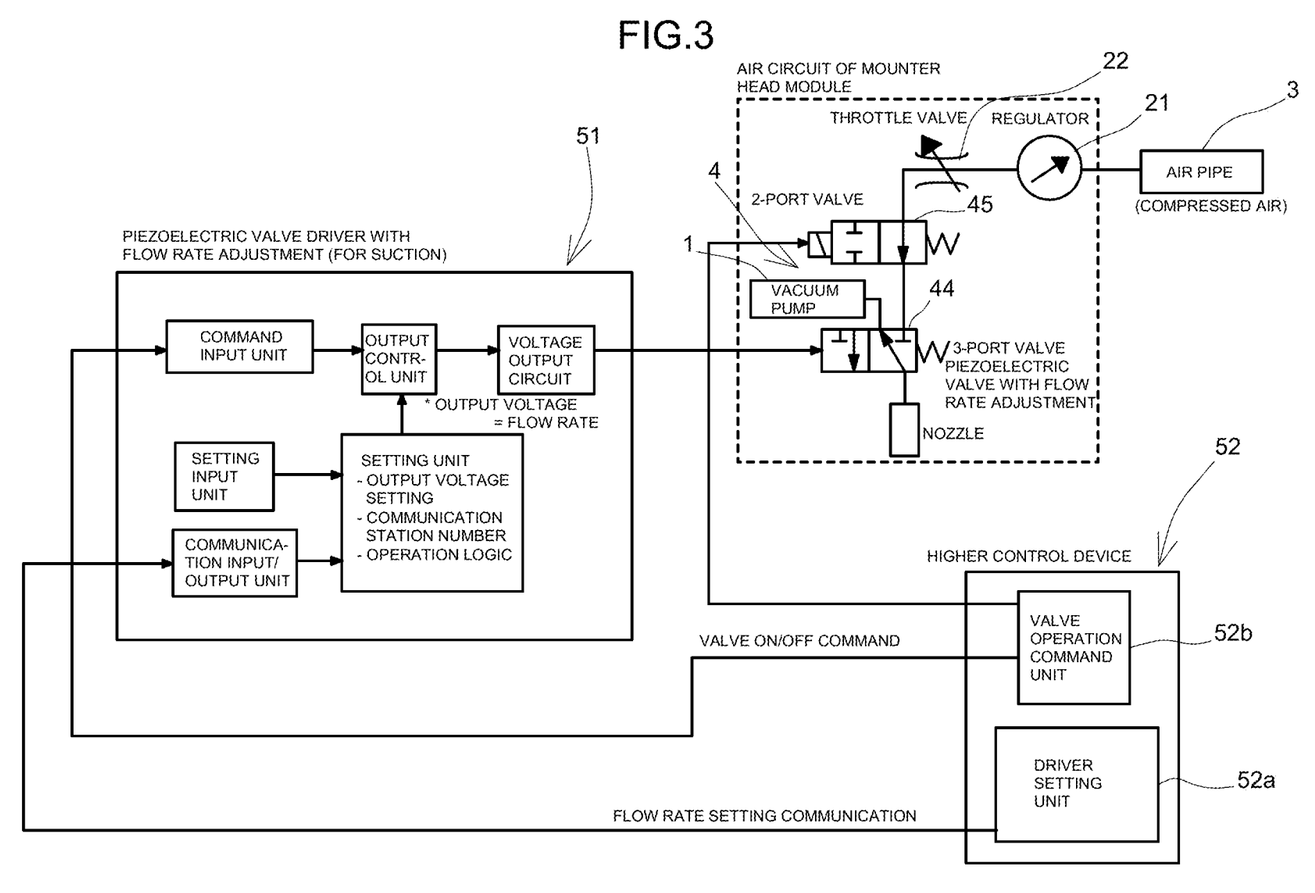
FIG. 3 is a diagram illustrating an air control device according to a second embodiment of the present invention.

Next, a second embodiment of the present invention will be described with reference to FIG. 3. It is noted that identical reference numerals are given to constituent components substantially common to those of the first embodiment, or some reference numerals are omitted, and the description is omitted.

The first embodiment differs from the second embodiment in that in the former, the variable throttle mechanism 4 is configured of the 2-port valve 41 being a throttle valve, and in the latter, the variable throttle mechanism 4 is configured of a 3-port valve 44 being a throttle valve. This circuit configuration is improved from that of a conventional example of FIG. 10.

That is, a piezoelectric valve 44 is interposed between the vacuum pump 1 configuring a negative pressure region and the nozzle n and is configured to continuously adjust a throttle. If the piezoelectric valve 44 is in a normal state, the piezoelectric valve 44 is at a position for allowing communication to a regulator 21 or the like being a positive pressure region while shutting off the negative pressure region, with respect to the nozzle n. The piezoelectric valve 44 receives a valve operation command from the piezoelectric valve driver 51 to shut off the communication to the positive pressure region and allow the communication between the negative pressure region and the nozzle n while continuously changing the throttle. Further, a 2-port valve 45 serves a role of turning on and off the communication between the regulator 21 and the 3-port valve 44, and operates upon receiving an input from the valve operation command unit 52b of the higher control device 52.

Even with such a configuration, the operation and effect similar to those of the above-described embodiment are achieved.

Third Embodiment

Figure 4:
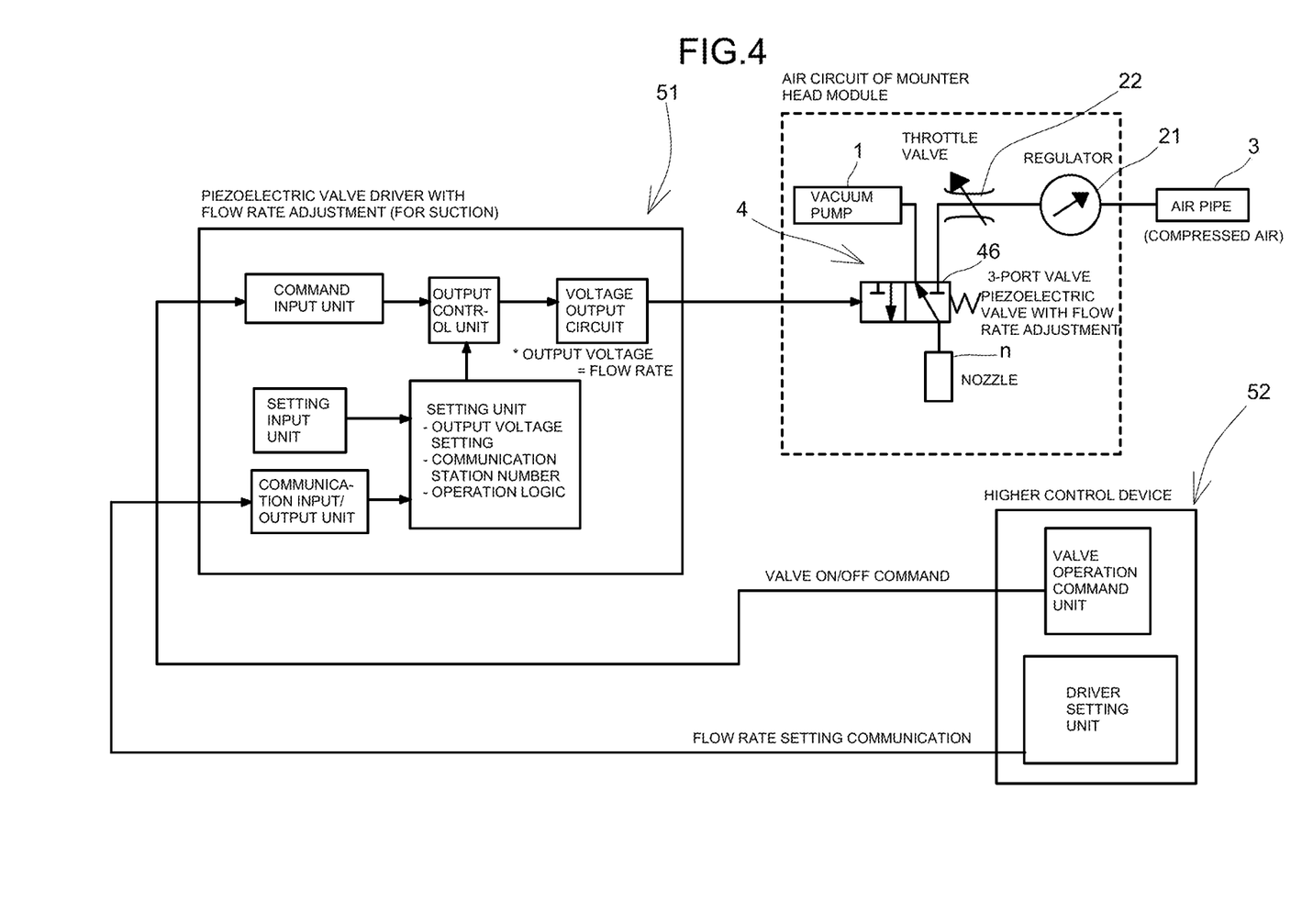
FIG. 4 is a diagram illustrating an air control device according to a third embodiment of the present invention.

Next, a third embodiment of the present invention will be described with reference to FIG. 4. It is noted that identical reference numerals are given to constituent components substantially common to those of the above-described embodiments, or some reference numerals are omitted, and the description is omitted.

Each of the above-described embodiments differs from the third embodiment in that in the former, the two valves including the function of the variable throttle mechanism 4 are employed, and in the latter, a 3-port valve 46 being a throttle valve is employed for the variable throttle mechanism 4 to allow the 3-port valve 46 to be imparted with a function of switching the positive pressure region. This circuit configuration is improved from that of a conventional example of FIG. 9.

That is, if the 3-port valve 46 is in a normal state, the 3-port valve 46 is at a position for shutting off communication to the vacuum pump 1 configuring a negative pressure region and allowing communication to the regulator 21 or the like configuring a positive pressure, with respect to the nozzle n. The 3-port valve 46 receives a valve operation command from the piezoelectric valve driver 51 to shut off the communication to the positive pressure region and allow the communication between the negative pressure region and the nozzle n while continuously changing the throttle.

Even with such a configuration, the operation and effect similar to those of the above-described embodiments are achieved.

Fourth Embodiment

Figure 5:
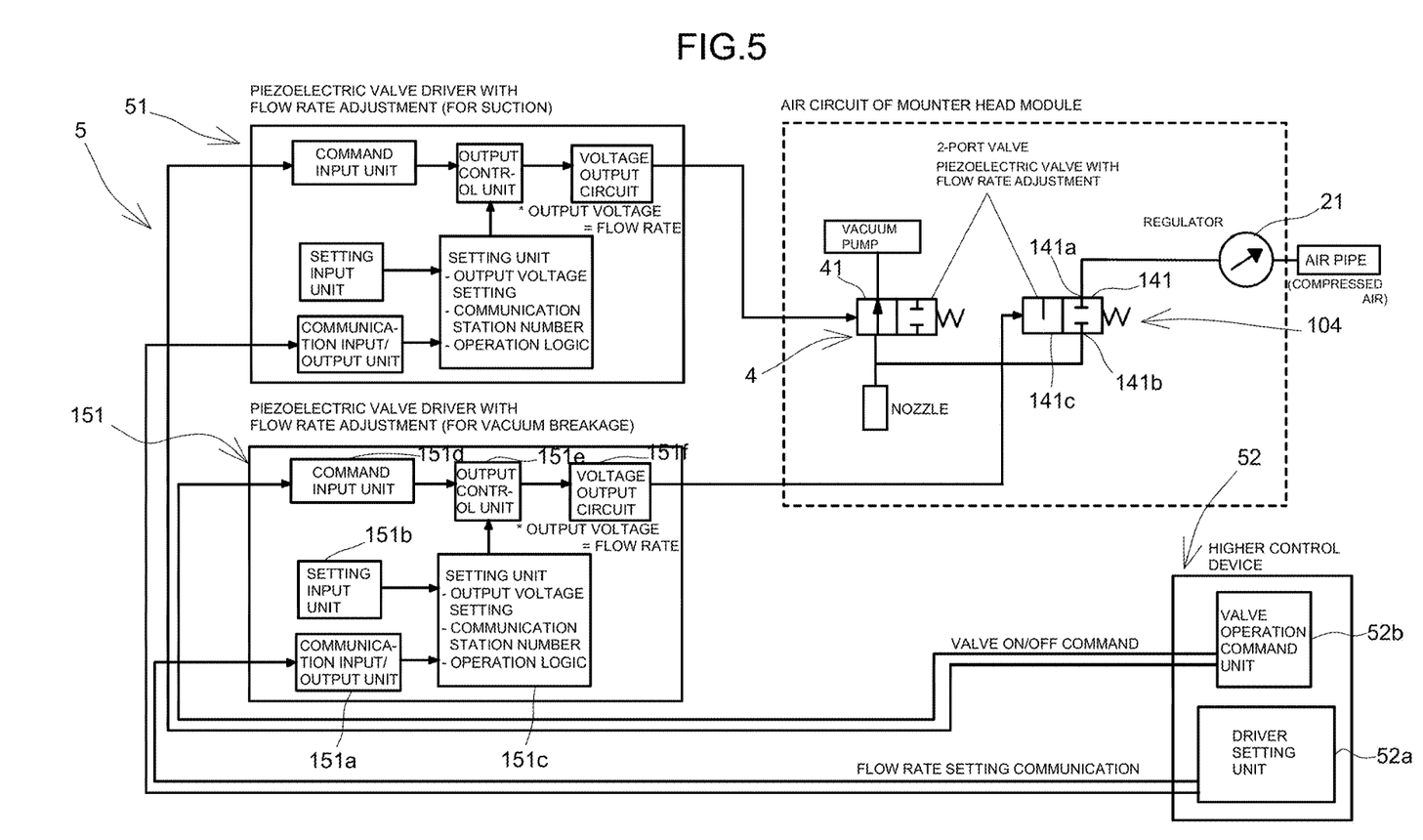
FIG. 5 is a diagram illustrating an air control device according to a fourth embodiment of the present invention.

A configuration in FIG. 5 is obtained by modifying that of FIG. 2 and FIG. 5 illustrates a configuration in which a piezoelectric valve 141 is employed instead of the solenoid valve 61 on an air supply side. It is noted that identical reference numerals are given to constituent components substantially common to those of FIG. 2, or some reference numerals are omitted, and the description is omitted.

The air control device according to the fourth embodiment has a configuration in which the head module HM of the mounter is further mounted with a flow rate adjustment mechanism 104 interposed between the positive pressure region and the nozzle n and configured to change a flow rate of air from the positive pressure region to the nozzle n by electric driving, and the control unit 5 controls a flow rate of a throttle valve 141 configuring the flow rate adjustment mechanism 104, based on a predetermined applied voltage or applied current to break a vacuum in the nozzle n.

This circuit configuration is also improved from that of a conventional example of FIG. 10.

The throttle valve 141 is configured of a 2-port valve where an activation unit 141c is interposed between a first port 141a communicating to a discharge port of the regulator 21 configuring a positive pressure region and a second port 141b communicating to the nozzle n, and the 2-port valve shuts off the communication between the both ports 141a and 141b at a first activation position and allows the communication between the both ports 141a and 141b at a second activation position. Specifically, the throttle valve 141 is a piezoelectric valve using a piezo element, is configured to be normally closed, and has a flow rate adjustment function in which a flow rate is variable as a result of the activation unit 141c being continuously deformed or displaced between the first activation position and the second activation position according to a level of voltage applied from outside to thereby change a flow rate of air to pass through. Therefore, if the 2-port valve 141 is employed, it is possible to finely adjust the flow rate of air and the pressure to be supplied to the nozzle n. The throttle valve 41, which employs a piezoelectric valve, is characterized in that responsiveness after a voltage is applied is quicker than, for example, an electromagnetic valve or a proportional valve.

On the other hand, the control unit 5 includes a piezoelectric valve driver 151 connected to the higher control device 52.

The piezoelectric valve driver 151 includes a communication input/output unit 151a, a setting input unit 151b, a setting unit 151c, a command input unit 151d, an output control unit 151e, and a voltage output circuit 151f. The higher control device 52 includes the driver setting unit 52a and the valve operation command unit 52b.

The driver setting unit 52a sets the flow rate to the setting unit 151c of the piezoelectric valve driver 151 through the communication input/output unit 151a. Further, the valve operation command unit 52b inputs a valve on/off command to the piezoelectric valve driver 151. The valve operation command unit 52b includes a communication station number indicating which valve is to be driven.

If the communication input/output unit 151a is a communication means using data communication represented by RS485, Ethernet, CAN, or the like, upon flow rate setting data being input into the communication input/output unit 151a, the piezoelectric valve driver 151 writes the input data into the setting unit 151c. As a result, the setting unit 151c holds an output voltage setting, a communication station number, and an operation logic for each nozzle type. The output voltage setting is a setting relating to a flow rate (level of valve opening), the communication station number identifies which piezoelectric valve 141 is to be set, and the operation logic is used to set switching between a synchronous output and a one-shot output with respect to a signal of the command input unit 151d, set a voltage output waveform such as rising and falling, and set a one-shot pulse time, for example.

Next, a case will be described where the communication input/output unit 151a uses a communication means based on switching such as a contact input. The piezoelectric valve driver 151 uses the setting input unit 151b to write into the setting unit 151c an output voltage setting, an operation logic, switching between a synchronous output and a one-shot output, setting of a voltage output waveform such as rising and falling, setting of a one-shot pulse time, and the like. One group includes these setting values, and a plurality of groups are stored. When a switching means such as a contact input is used to switch groups, it is possible to perform a setting switch faster than a data communication means.

In such a configuration, the higher control device 52 firstly turns on the piezoelectric valve driver 51 and provides a required control as described in the first embodiment when the mounted component (part) is suctioned to bring the nozzle distal end to a required negative pressure state, and secondly turns off the piezoelectric valve driver 51 and turns on the piezoelectric valve driver 151 when the part is released. As a result, the piezoelectric valve driver 151 applies the output voltage, via the output control unit 151e and the voltage output circuit 151f, to the piezoelectric valve 141 of the corresponding nozzle n, according to the operation logic set by the setting unit 151c in association with the communication station number. Thus, the applied voltage is determined in advance, and thus, the responsiveness of the air supply is fastened In the piezoelectric valve 141, the activation unit 141c is continuously displaced in accordance with the applied voltage, and the piezoelectric valve 141 supplies air with a flow rate and a pressure most suitable for the type of nozzle. This air reaches the nozzle n and releases the suctioned part by the vacuum breakage. The released part is mounted on a target printed circuit board.

In this case also, to increase the efficiency of the mounter, the higher control device 52 outputs a valve operation command in parallel to movement of the nozzle n along XYZ axes before the head module HM reaches a target position, assuming a delay of a valve and a delay of a pressure change until a nozzle distal end reaches a target pressure.

With this configuration, if the head module HM of the mounter is further mounted with the flow rate adjustment mechanism 104 interposed between the positive pressure region and the nozzle n and configured to change a flow rate of air from the positive pressure region to the nozzle n by electric control, and the control unit 5 controls a flow rate of the flow rate adjustment mechanism 104, based on a predetermined applied voltage or applied current to break a vacuum in the nozzle n, and thus, it is possible to perform a flow rate control of air to be supplied to the nozzle n by using the flow rate adjustment mechanism 104, and it is possible to appropriately adjust a flow rate for the vacuum breakage according to types of parts and the nozzle n without stopping the operation of the mounter. Therefore, in this respect also, types of parts and nozzles that can be appropriately handled in one head module are increased to improve the facility operation rate.

Of course, such control for vacuum breakage can also be used in the first to third embodiments.

Fifth Embodiment

Figure 6:
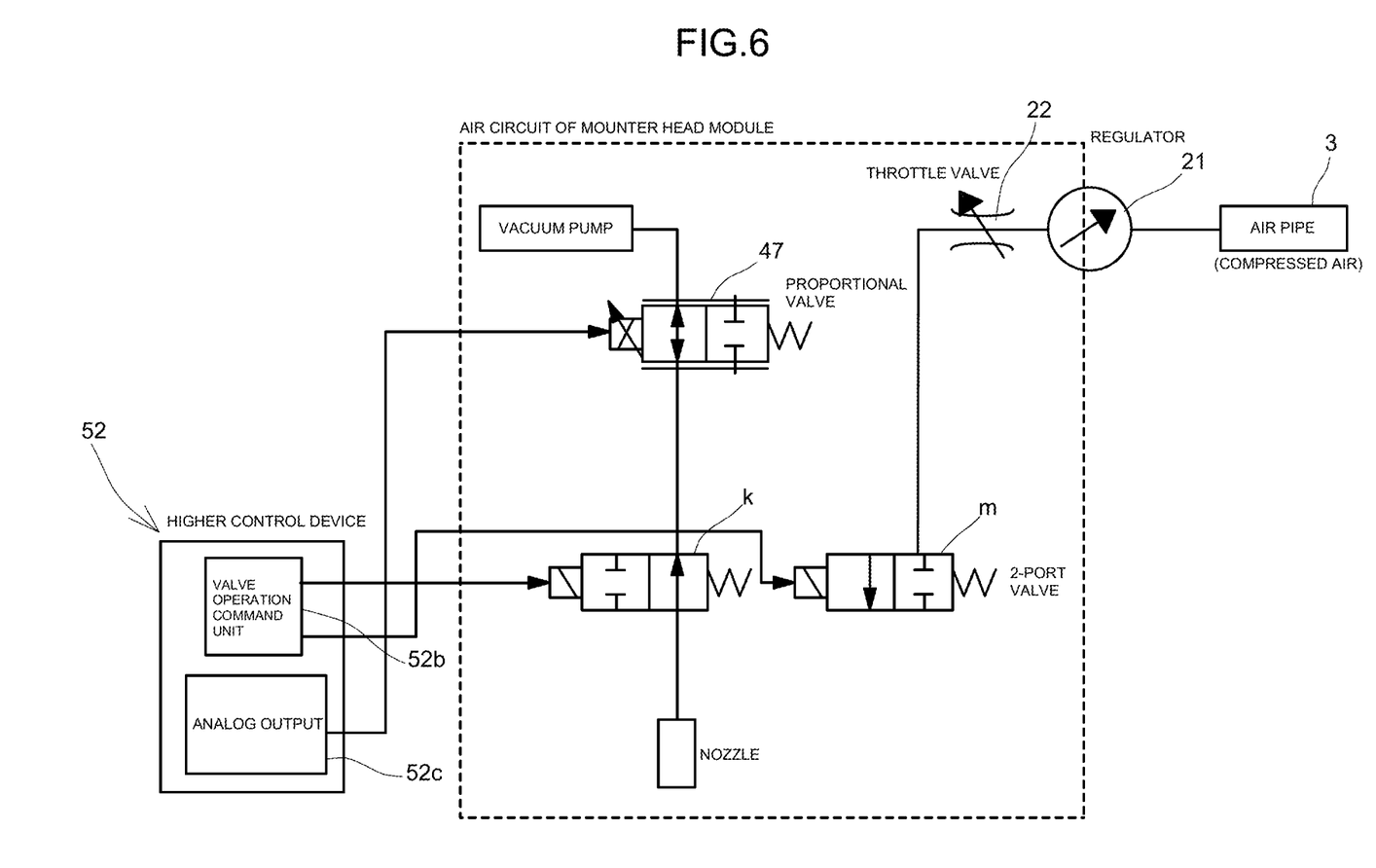
FIG. 6 is a diagram illustrating an air control device according to a fifth embodiment of the present invention.

Next, a fifth embodiment of the present invention will be described with reference to FIG. 6. It is noted that identical reference numerals are given to constituent components substantially common to those of each of the above-described embodiments, or some reference numerals are omitted, and the description is omitted.

In each of the above embodiments, the throttle valve of the variable throttle mechanism 4 is configured of the piezoelectric valve; however, the variable throttle mechanism 4 in the fifth embodiment is different in that the throttle valve is changed to a proportional valve 47.

That is, this circuit configuration is improved from that of a conventional example illustrated in FIG. 11, where the proportional valve 47 is arranged between the 2-port valve k and the vacuum pump 1, and a level of opening, that is, a throttle between the nozzle n and the vacuum pump 1 configuring a negative pressure region is continuously variable based on an output from an analog output unit 52c of the higher control device 52. The 2-port valve m configured to connect the nozzle n to the positive pressure region is also controlled by the valve operation command unit 52b If the proportional valve 47 is individually provided for each of the nozzles n, a weight of the head module HM increases and the responsiveness is poor, and thus, it is not possible to instantaneously switch; however, even if the proportional valve 47 is employed, an operation and effect equivalent to those of the above-described embodiments where the piezoelectric valve is employed can be exhibited in a sense that the head module HM can be commonly used to satisfy both the high-speed and multi-function applications without stopping the operation of the mounter and a need for replacing the head module can be eliminated.

OTHER EMBODIMENTS

Figure 7:
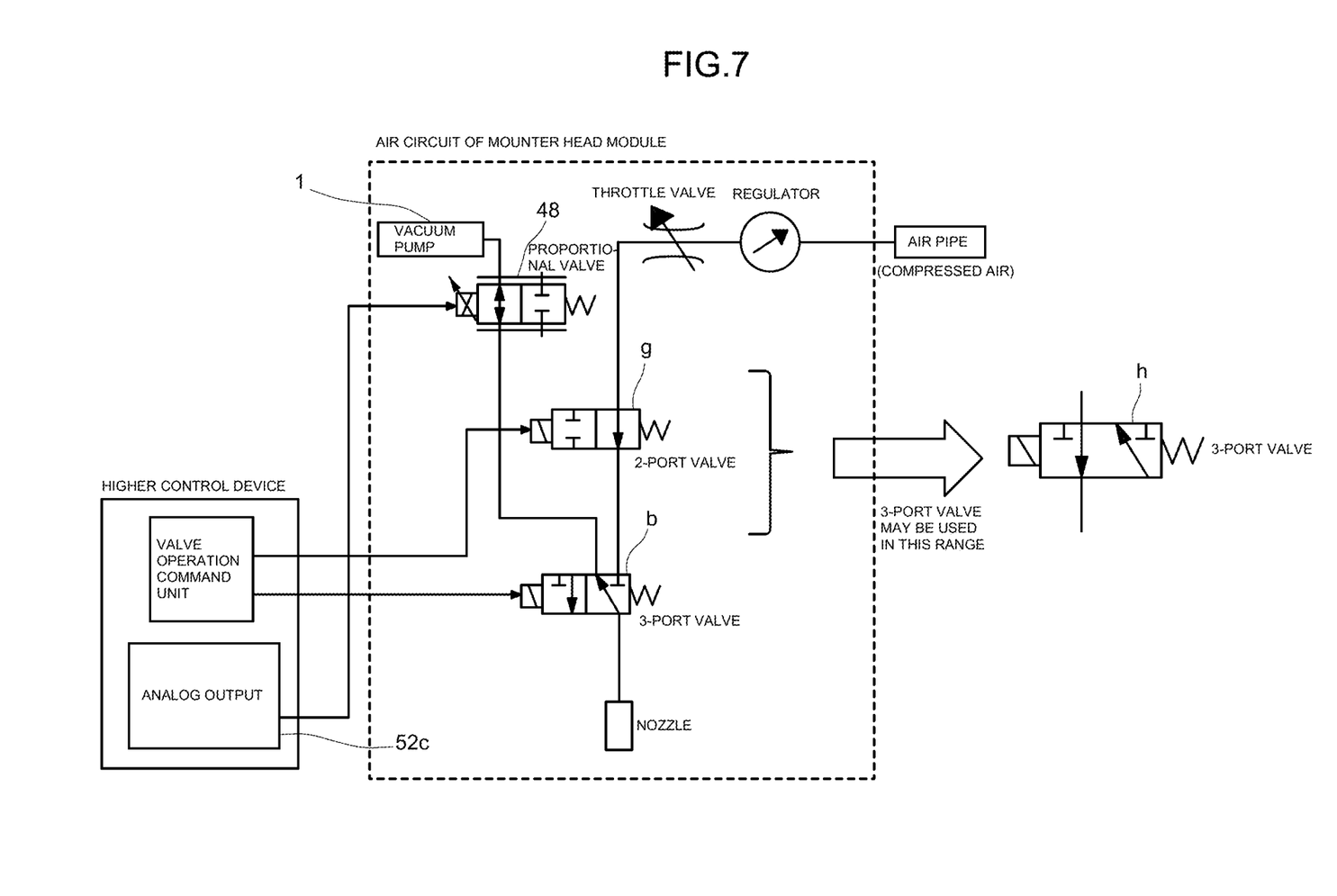
FIG. 7 is a diagram illustrating an air control device according to another embodiment of the present invention.
Figure 8:
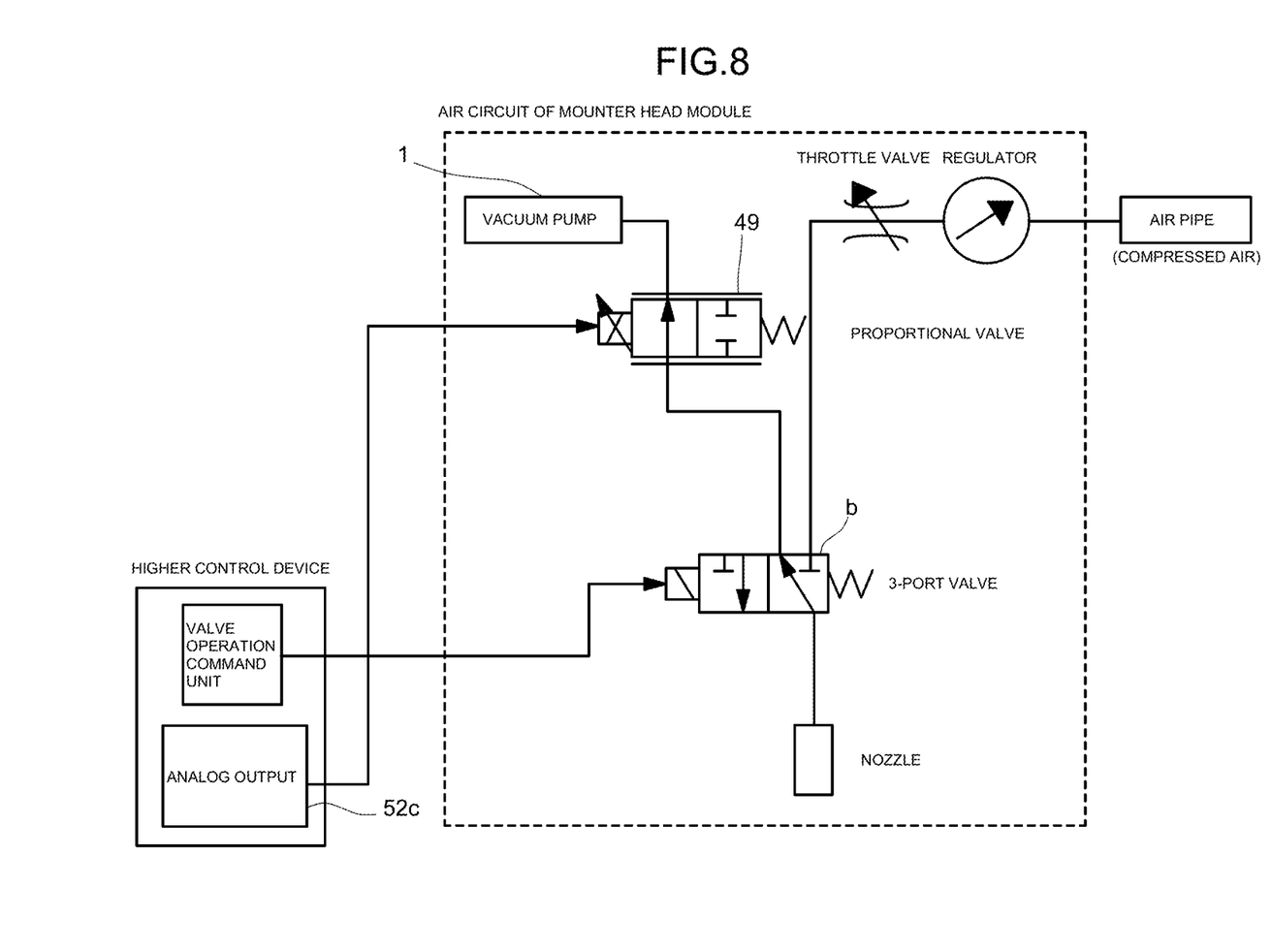
FIG. 8 is a diagram illustrating an air control device according to still another embodiment of the present invention.

FIG. 7 illustrates a circuit configuration improved from that of a conventional example illustrated in FIG. 10, where a proportional valve 48 is arranged between the 3-port valve b and the vacuum pump 1, and a throttle is continuously controlled by the analog output unit 52c. Further, FIG. 8 illustrates a circuit configuration improved from that of a conventional example illustrated in FIG. 9, where a proportional valve 49 is arranged between the 3-port valve b and the vacuum pump 1, and a throttle is continuously controlled by the analog output unit 52c.

Even with these configurations, a similar operation and effect to those in the fifth embodiment can be obtained.

Although several embodiments of the present invention were explained above, the specific configuration of each of components is not limited to those in the embodiments described above.

For example, when the present invention is applied to a plurality of nozzles irrespective of the category of the nozzle such as a multi-function application and a high-speed application, the variable throttle mechanism 4 can perform a flow rate control suitable for the nozzle.

In the above embodiments, one variable throttle mechanism 4 is provided for one nozzle n; however, although not illustrated, a configuration may be adoptable where one variable throttle mechanism is provided for a plurality of nozzles and a direction control valve (flow path control valve) is provided for each of the nozzles downstream of the variable throttle mechanisms.

Further, in the above embodiments, the piezoelectric driver is arranged outside the head module; however, the piezoelectric drive may be mounted on the head module if a weight and a space of the piezoelectric drive do not cause a problem.

Alternatively, in the above embodiments, the vacuum pump is mounted on the head module; however, the vacuum pump may be arranged outside the head module if vacuum evacuation is appropriately performed.

The air control device according to the present embodiment is applied to a mounter; however, this is not limiting, and the air control device may also be applied to a visual inspection machine, a measurement sorting machine, a taping machine, and the like.

Various other changes may be applied to other configurations without departing from the spirit of the present invention.

INDUSTRIAL APPLICABILITY

The present invention can be utilized as an air control device for a mounter configured to appropriately suction a part by vacuum using a nozzle through a head module of a mounter.

REFERENCE SIGNS LIST

4 Variable throttle mechanism
5 Control unit
51c Setting unit
51e Output control unit
104 Flow rate adjustment mechanism
HM Head module
n Nozzle
n1 Nozzle (for high speed)
n2 Nozzle (for multi-function)

The invention claimed is:

1. An air control device for a mounter comprising a plurality of nozzles, including high-speed nozzles and multifunctional nozzles, detachably attached to a head module of the mounter, each nozzle of the plurality of nozzles is connected to a negative pressure region, and a part is suctioned at a distal end of at least one nozzle of the plurality of nozzles, and the head module comprises a variable throttle mechanism for each nozzle of the plurality of nozzles, and by using each variable throttle mechanism, an amount of air to be drawn into the negative pressure region from each nozzle of the plurality of nozzles is adjustable, each variable throttle mechanism is made electrically controllable by a control means,
the control means comprises a command input unit for inputting an ON/OFF command for operating each variable throttle mechanism, a setting unit that sets an applied voltage value or an applied current value for each variable throttle mechanism in advance, and an output control unit that applies an applied voltage or an applied current corresponding to the applied voltage value or the applied current value set in the setting unit to each variable throttle mechanism by inputting the ON/OFF command, the control means controls a flow rate of each variable throttle mechanism based on the applied voltage or the applied current corresponding to the applied voltage value or the applied current value, by once setting the setting unit and then inputting the ON/OFF command to the command input unit, a voltage or a current is applied to each variable throttle mechanism through the output control unit, and as a target of the control means, the variable throttle mechanism for the high-speed nozzles and the variable throttle mechanism for the multifunctional nozzles is provided side by side in the head module.

2. The air control device for a mounter according to claim 1, wherein each of the variable throttle mechanisms are provided for different applications, and the plurality of variable throttle mechanisms are set with a flow rate according to the applications.

3. The air control device for a mounter according to claim 1, wherein the plurality of variable throttle mechanisms are set with a flow rate according to the plurality of nozzles.

4. The air control device for a mounter according to claim 2, wherein the plurality of variable throttle mechanisms are set with a flow rate according to the plurality of nozzles.

5. The air control device for a mounter according to claim 1 wherein the head module of the mounter is further mounted with a flow rate adjustment mechanism interposed between a positive pressure region and the plurality of nozzles and configured to change a flow rate of air from the positive pressure region to each nozzle of the plurality of nozzles by electric driving, and the control unit is configured to control a flow rate of the flow rate adjustment mechanism, based on the predetermined applied voltage or applied current and to break a vacuum in the each nozzle of the plurality of nozzles.

* * * * *